(12) United States Patent
Midya et al.

(10) Patent No.: US 6,965,339 B2
(45) Date of Patent: Nov. 15, 2005

(54) METHOD AND SYSTEM FOR ANALOG TO DIGITAL CONVERSION USING DIGITAL PULSE WIDTH MODULATION (PWM)

(75) Inventors: Pallab Midya, Palatine, IL (US); Matthew R. Miller, Arlington Heights, IL (US); Patrick L. Rakers, Kildeer, IL (US)

(73) Assignee: Motorola, Inc., Schaumburg, IL (US)

( * ) Notice: Subject to any disclaimer, the term of this patent is extended or adjusted under 35 U.S.C. 154(b) by 51 days.

(21) Appl. No.: 10/819,644

(22) Filed: Apr. 7, 2004

(65) Prior Publication Data

US 2005/0225467 A1    Oct. 13, 2005

(51) Int. Cl.[7] ............................................. H03M 1/34
(52) U.S. Cl. ..................... 341/163; 341/143; 341/126
(58) Field of Search .............................. 341/163, 155, 341/156, 143, 61, 126

(56) References Cited

U.S. PATENT DOCUMENTS

| | | | |
|---|---|---|---|
| 4,325,112 A | | 4/1982 | Otsuka |
| 5,457,456 A | * | 10/1995 | Norsworthy ................. 341/61 |
| 5,548,286 A | * | 8/1996 | Craven ........................ 341/126 |
| 5,786,778 A | * | 7/1998 | Adams et al. ................. 341/61 |
| 6,373,334 B1 | | 4/2002 | Melanson |
| 6,385,067 B2 | | 5/2002 | Galbiati et al. |
| 6,580,376 B2 | * | 6/2003 | Perrott ........................ 341/61 |
| 6,590,426 B2 | * | 7/2003 | Perrott ........................... 327/7 |

* cited by examiner

*Primary Examiner*—John B Nguyen (57) ABSTRACT

A system and method for analog-to-digital conversion using digital pulse width modulation (PWM) is disclosed. The method and system according to the disclosed invention converts an analog input signal to a digital signal in pulse code modulated (PCM) form. The disclosed invention uses a feedback circuit to perform PWM of the analog input signal. The PWM signal is then decimated to obtain the digital signal in PCM form. The system according to the disclosed invention requires lower operating frequency and dissipates lesser power than prior art systems providing the same sampling frequency and resolution. The operation at a lower frequency is achieved by obtaining two samples from every pulse of the PWM signal; the first sample being obtained from the right duty ratio, and the second sample being obtained form the left duty ratio. Further, the disclosed invention has lesser implementation complexity and higher signal-to-noise ratio than prior art.

19 Claims, 7 Drawing Sheets

METHOD AND SYSTEM FOR ANALOG TO DIGITAL CONVERSION USING DIGITAL PULSE WIDTH MODULATION (PWM)

BACKGROUND

The disclosed invention relates to the field of analog to digital conversion. More specifically, the disclosed invention relates to the field of analog-to-digital converters (ADCs) that use pulse width modulation (PWM).

Analog-to-digital conversion is an electronic process in which a continuously variable (analog) signal is changed, without altering its essential content, into a multi-level discretely varying digital signal. The input to an analog-to-digital converter (ADC) consists of an analog input signal. The ADC converts this input in to a digital output that has discrete levels or states. The states are represented as a combination of one or more binary digits (bits). The number of states is usually a power of two—that is, 2, 4, 8, 16, etc. The simplest digital signals have only two states, and are called binary signals.

Digital signals are preferred over analog signals for most communication applications due to two factors. First, digital signals have a high error margin compared to analog signals. Digital signals are in the form of digital impulses that are well defined and orderly. Thus, it is easier for electronic circuits to distinguish digital signals from noise. Second, a large variety of error detection and correction schemes have been developed for digital signals, while such schemes are practically non-existent for analog signals. Thus, most state of the art communication applications convert the analog data into digital data for transmission.

Further, all modern day computers perform their processing in terms of binary digital signals. These computers are used for a variety of applications that require interaction with analog interfaces. Some examples of such applications are voice processing, video processing, digital signal processing, modems and instrumentation applications. For these applications, a computer converts an analog signal to a digital signal for processing. Use of computers for the applications described above presents a need for analog-to-digital conversion. In general, in any digital signal processing system, an ADC is required if the input signal is analog. Some examples of applications that are based on ADCs are telephone modems, xDSL modems and cellular phones. A typical telephone modem makes use of an ADC to convert the incoming audio from a twisted-pair line into digital signals in a format that can be processed by a computer.

Many ADC architectures are known today. Different ADC architectures offer different advantages in terms of the speed of conversion, resolution of conversion, cost (or complexity) of implementation, power consumption, etc. A classical ADC architecture called the Flash ADC compares the input signal to a reference voltage and decodes the result into a digital signal. The Flash ADC architecture employs the fastest analog-to-digital conversion technique. However, the implementation of a Flash ADC needs $2^N$ comparators where N is the number of bits of resolution. Resolution of an ADC can be defined as the number of bits used to represent each sample of a digital signal corresponding to an analog signal. As a result of employing $2^N$ comparators for N bits resolution, the number of comparators increases exponentially with an increase in resolution. Hence, the power consumption increases exponentially with an increase in resolution. Thus, Flash ADCs suffer from the drawbacks of costly circuit implementations and high power consumption.

Though many improved architectures for Flash ADCs have been proposed, practical solutions are limited to about 8 bits of resolution to achieve optimum performance.

Another architecture for analog-to-digital conversion is known as Pipeline ADC. Pipeline ADCs are implemented using multiple stages cascaded together. Each stage is implemented using a 2-step Flash ADC. Pipeline ADCs are cheaper to implement than Flash ADCs. Moreover, Pipeline ADCs are less complex than Flash ADCs that offer similar resolution. Also, the power drain of Pipeline ADCs is lesser than that of Flash ADCs. However, Pipeline ADCs introduce a finite latency between the analog sample (of an analog signal) and the digital representation of the sample. The duration of the latency is dependent on the number of stages in the pipeline. Another drawback of Pipeline ADCs is that when the resolution of conversion is increased, the conversion speed of the ADC reduces. This is due to the fact that the input stages have to be more accurate in resolving the input signal, resulting in slower conversion speeds because of the settling time of the amplifier. Time interleaving of multiple Pipeline ADCs has been demonstrated in an effort to address this drawback. However, the time interleaving technique is limited by the accuracy of the sampling interval relative to the other stages, the relative gain and offset match, and the timing jitter of the sampling clocks.

Another class of ADCs is the Successive Approximation ADCs. Successive Approximation ADCs also allow high resolutions. However, Successive Approximation ADCs are slow since they usually require N cycles to perform the analog-to-digital conversion for a resolution of N bits.

A high-speed architecture for analog-to-digital conversion is used in Folding ADCs in which the signal is "folded" by using several folding amplifiers to replicate the input signal. The digital output signal is produced by detecting zero crossings of the folding amplifiers. Though Folding ADCs are faster than Successive Approximation ADCs, the folding technique requires many folding amplifiers for higher resolution. This results in relatively high power consumption. Also, the main disadvantage of the folding ADC is the reduced bandwidth due to the internal multiplication of the input signal frequency with the folding rate. The number of folding amplifiers can be reduced by using interpolation. However interpolation, when used with folding limits the resulting dynamic range of the converter.

Another popular class of ADCs is the Sigma-Delta ADC. The Sigma-Delta ADCs allow much higher resolutions (10 to 24 bits). However, these ADCs are relatively slow since the requisite level resolution is achieved by oversampling the input signal and noise shaping. Thus, the performance of Sigma-Delta ADCs is directly influenced by the oversampling ratio used by the ADC. There are primarily two kinds of Sigma-Delta ADCs used for advanced wideband applications: Multi-bit Sigma-Delta ADCs and Continuous Time Sigma-Delta ADCs. Multi-bit Sigma Delta ADCs do not require a high oversampling ratio, but have very high power dissipation (approaching 40–50 mW for W-CDMA). On the other hand Continuous Time Sigma Delta ADCs have low analog power dissipation (<5 mW), but require high sampling frequencies (300 MHz). This results in increased power dissipation.

Another approach to analog-to-digital conversion has been described in U.S. Pat. No. 5,548,286, titled "Analogue and digital convertors using pulse edge modulators with non-linearity error correction", assigned to B&W Loudspeakers Ltd. The patent discloses an ADC using pulse edge modulation. The pulse edge modulation technique is also known as pulse width modulation (PWM). An advantage of the disclosed approach is that it provides a means for performing multi-bit quantization within the sigma-delta loop using only a single comparator. A second advantage is that the PWM signal visits only two distinct amplitude levels. This makes the implementation of the feedback DAC in the sigma-delta loop much easier. However, the disclosed approach suffers from the following drawbacks. The sawtooth waveform required in the disclosed approach is difficult to generate at high speeds with linearity and low noise. Both these properties directly affect the performance of the ADC. Thus, the signal-to-noise ratio (SNR) of the output of the ADC is adversely affected for high-speed conversion. This limits the bandwidth of the input signal for which the ADC can function satisfactorily.

Thus, there is a need for an ADC that offers high resolution of conversion and does not require a high oversampling rate. Also, there is a need for an ADC that has low power dissipation and achieves high SNR for high-speed conversions. Further, there is a need for an ADC that does not require complex (or costly) hardware for implementation.

SUMMARY

The disclosed invention provides a system and method for analog-to-digital conversion using digital pulse width modulation.

The method and system according to the disclosed invention converts an analog input signal to a digital output signal in pulse code modulated form. To achieve this objective, the disclosed invention uses a feedback circuit to generate a pulse width modulated signal corresponding to the analog input signal. The feedback circuit comprises an error amplifier and a converter. The error amplifier calculates an error signal using the analog input signal and a pulse width modulated signal in a feedback loop. The converter is used for converting the error signal into a pulse width modulated signal.

According to a first embodiment of the disclosed invention, the converter comprises a first comparator and a second comparator to compare the error signal with a high signal and a low signal respectively. The outputs of the first and second comparators are fed to the J and K inputs of a JK flip-flop respectively to obtain the digital pulse feedback signal.

According to a second embodiment of the disclosed invention, the converter comprises a hysteretic comparator to compare the error signal with a ground voltage. The output of the hysteretic comparator is fed to a D flip-flop to obtain the digital pulse feedback signal.

According to a third embodiment of the disclosed invention, the error signal is converted into the pulse width modulated signal using a flash ADC followed by a pulse generator. The pulse width modulated signal is fed back to the error amplifier. Further, the pulse width modulated signal is decimated to obtain the digital signal in pulse code modulated form.

The system and method according to the disclosed invention requires lower operating frequency and dissipates lesser power than prior art systems that provide the same sampling frequency and resolution. Further, the disclosed invention has lesser implementation complexity and higher signal-to-noise ratio than prior art.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF PREFERRED EMBODIMENTS

The disclosed invention provides a method and system for analog-to-digital conversion using pulse width modulation. The ADCs according to the disclosed invention operate at lower clock frequencies and dissipate lesser power than prior art ADCs that provide the same sampling rate and resolution.

Figure 1:
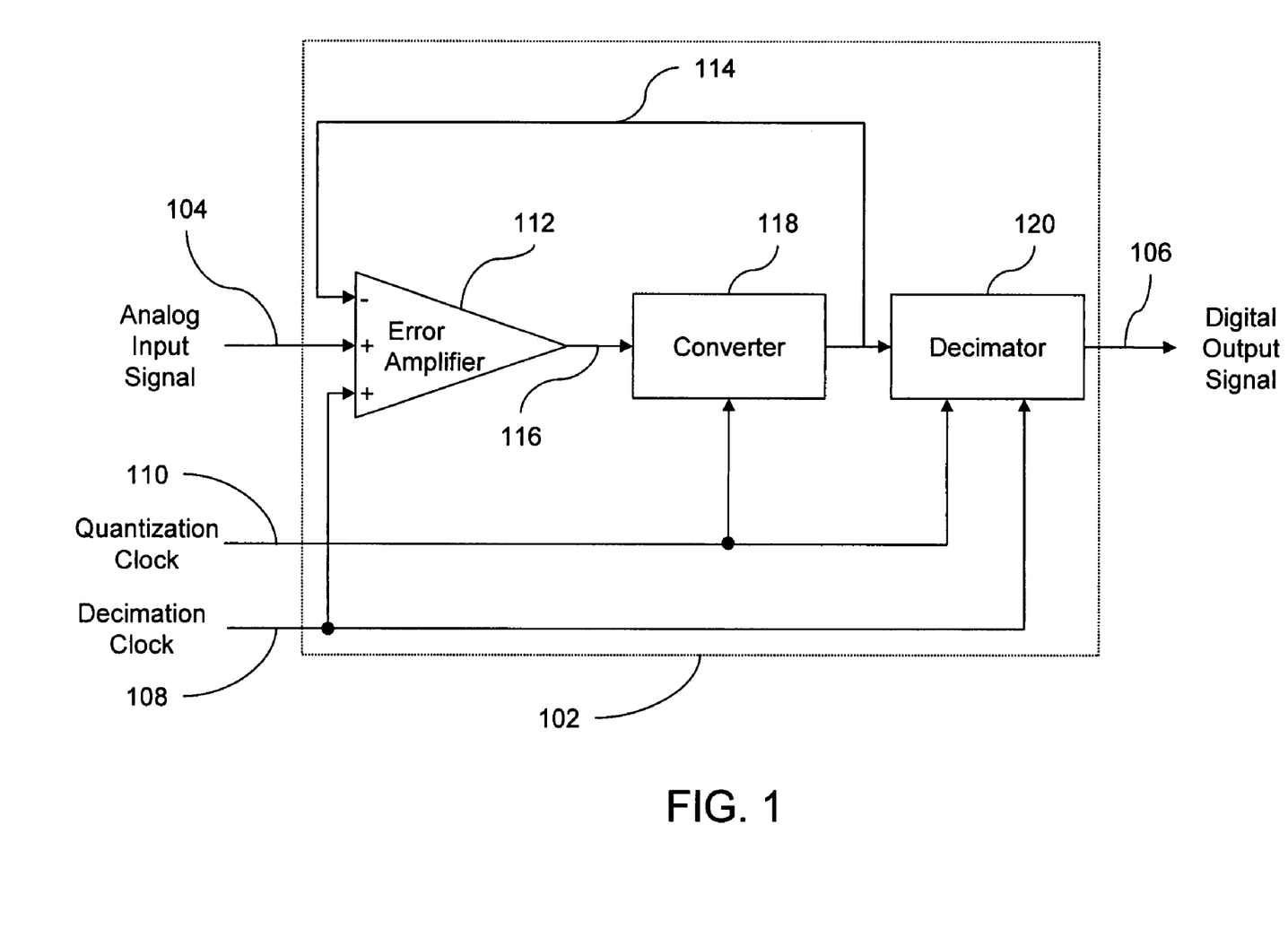
FIG. 1 is a block diagram illustrating an ADC according to one embodiment of the disclosed invention.

Referring now to FIG. 1, a block diagram illustrating an ADC according to one embodiment of the disclosed invention is hereinafter described. The figure shows an ADC 102 converting an analog input signal 104 to a digital output signal 106. Digital output signal 106 is the digital representation of analog input signal 104 encoded using pulse code modulation (PCM). Such conversion of analog input signal 104 involves sampling analog input signal 104 at time instants called sampling instants to obtain a sample value at each sampling instant. The frequency with which these sample values are obtained is known as the sampling frequency of ADC 102. These sample values are then quantized by mapping them to one of a set of discrete quantization levels. The number of quantization levels available for this mapping is determined by the resolution of ADC 102. The conversion of analog input signal 104 to digital output signal 106 is governed by the sampling frequency and the resolution of ADC 102.

The sampling frequency of ADC 102 is determined by the frequency of a decimation clock 108. Further, the number of quantization levels used by ADC 102 is determined by the frequency of a quantization clock 110. Both decimation clock 108 and quantization clock 110 are provided externally to ADC 102. This allows a user to adjust the sampling frequency and resolution of ADC 102.

The figure shows an error amplifier 112 with three inputs: analog input signal 104, decimation clock 108 and a digital pulse feedback signal 114. Error amplifier 112 adds analog input signal 104 and decimation clock 108, and subtracts digital pulse feedback signal 114 from the result of the addition. The value thus obtained is integrated to obtain an error signal 116. Thus, the slope (rate of change) of error signal 116 is obtained by adding analog signal 104 and decimation clock 108, and subtracting digital pulse feedback signal 114 from the result. Error signal 116 is fed to a converter 118 that converts it to digital pulse feedback signal 114. Two implementations of the converter are provided with reference to FIG. 3A and FIG. 3B. Digital pulse feedback signal 114 is provided as input to error amplifier 112 in a feedback loop.

Digital pulse feedback signal 114 thus obtained comprises two sample values in every pulse of the signal. The first sample value is obtained from the right duty ratio of digital pulse feedback signal 114 and the second sample value is obtained from the left duty ratio of digital pulse feedback signal 114. This is further described with reference to FIG. 4.

Error amplifier 112 and converter 118 when connected as described above perform pulse width modulation (PWM) of analog input signal 104. The resulting pulse width modulated signal, digital pulse feedback signal 114, is fed to a decimator 120. Decimator 120 converts digital pulse feedback signal 114 to digital output signal 106 by performing a PWM to PCM conversion. Many techniques for converting PWM to PCM are known in the art. One such technique is described in FIG. 5.

Figure 2:
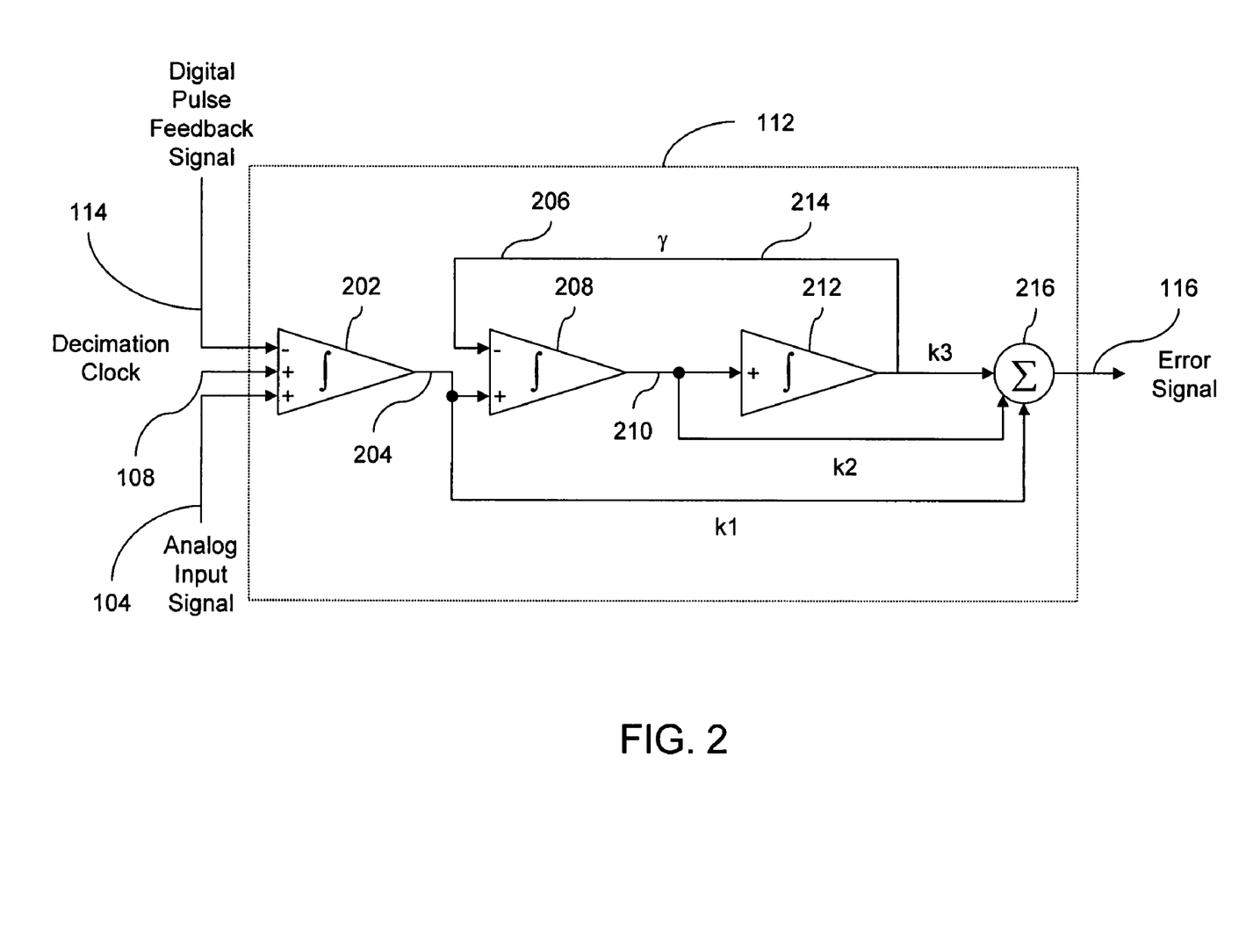
FIG. 2 is a block diagram illustrating a continuous time integrating error amplifier suitable for use with the disclosed invention.

Referring now primarily to FIG. 2, a continuous time integrating error amplifier suitable for use as error amplifier 112 according to one embodiment of the disclosed invention is hereinafter described. The figure shows analog input signal 104, decimation clock 108 and digital pulse feedback signal 114 being fed to error amplifier 112 to obtain error signal 116. These three inputs are fed to a first integrator 202 to obtain a first integrator output 204. First integrator output 204 along with a feedback signal 206 is fed to a second integrator 208. A second integrator output 210 thus obtained is fed to a third integrator 212, which outputs a third integrator output 214. A small fraction of third integrator output 214 is extracted by multiplying it by a small factor γ to obtain feedback signal 206. A weighted sum of first integrator output 204, second integrator output 210 and third integrator output 214 is calculated by multiplying these signals with weights k1, k2 and k3 respectively and adding the results using a summation block 216. The output of summation block 216 thus obtained gives error signal 116. This particular structure for error amplifier 112 typically yields a low pass ADC. That is, the quantization noise is shaped away from the bandwidth near DC. As is well known in the art, modifications to error amplifier 112 are possible which shape the quantization noise away from an arbitrary desired frequency band. Often these are referred to as band-pass ADCs.

Referring back to FIG. 1, error signal 116 is used as the input for converter 118, which converts it to digital pulse feedback signal 114. The disclosed invention provides two distinct system implementations of converter 118, according to two different embodiments of the disclosed invention. These two implementations are described with reference to FIG. 3A and FIG. 3B.

Figure 3A:
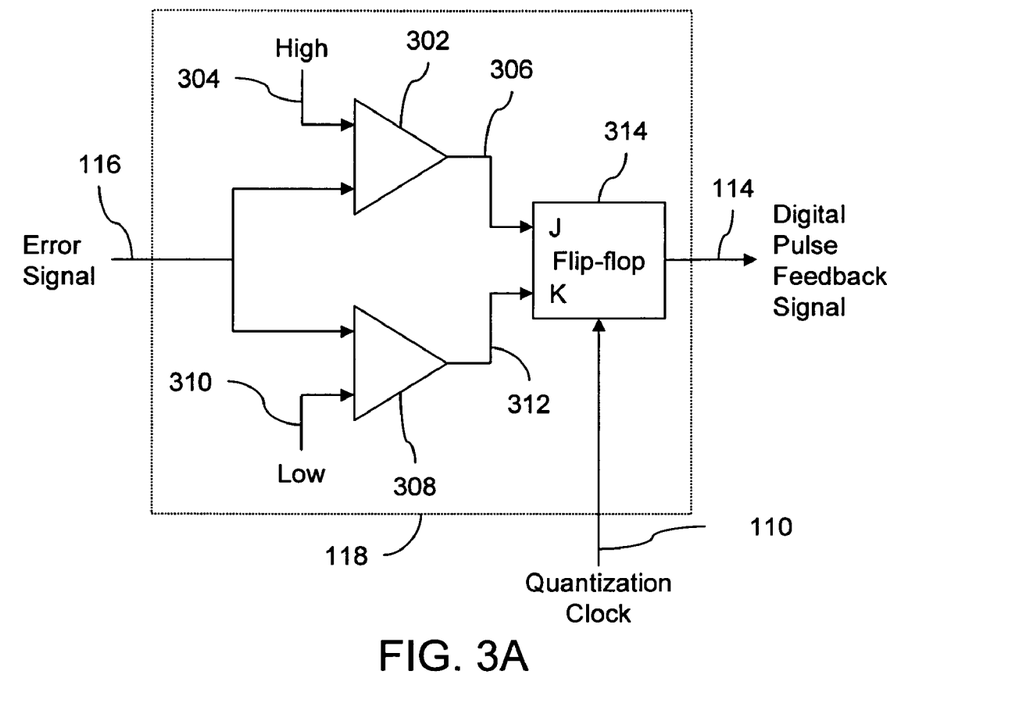
FIG. 3A is a block diagram illustrating an implementation of a converter according to a first embodiment of the disclosed invention.

Referring now primarily to FIG. 3A, an implementation of converter 118 according to the first embodiment of the disclosed invention is hereinafter described. The figure shows error signal 116 being fed to converter 118 to obtain digital pulse feedback signal 114 as the output. Error signal 116 is fed to a first comparator 302 for comparison with a high signal 304. High signal 304 is a reference signal used by converter 118. The choice of the value of high signal 304 is not especially critical to the operation of the circuit. A typical value for high signal 304 is halfway between the maximum value that error amplifier 112 can produce, and the median value of error amplifier 112 output. The result of this comparison is output as a first comparator output 306. If error signal 116 is lower than high signal 304, first comparator output 306 is low; otherwise first comparator output 306 is high. Similarly, error signal 116 is fed to a second comparator 308 for comparison with a low signal 310. Low signal 310 is a reference signal used by converter 118. The choice of the value of low signal 310 is not especially critical to the operation of the circuit. A typical value for low signal 310 is halfway between the minimum value that error amplifier 112 can produce, and the median value of error amplifier 112 output. The result of this comparison is output as a second comparator output 312. If error signal 116 is higher than low signal 310, second comparator output 312 is low; otherwise second comparator output 312 is high.

First comparator output 306 and second comparator output 312 are fed to a JK flip-flop 314 as the J and K inputs respectively. Quantization clock 110 is used as the clock source for JK flip-flop 314. The output thus obtained from JK flip-flop 314 is digital pulse feedback signal 114. The difference between high signal 304 and low signal 310 serves to prevent unwanted "chatter" in the digital pulse feedback signal 114. A side effect of this technique is that it places a lower bound on the signal swing that can be expected in error signal 116.

Figure 3B:
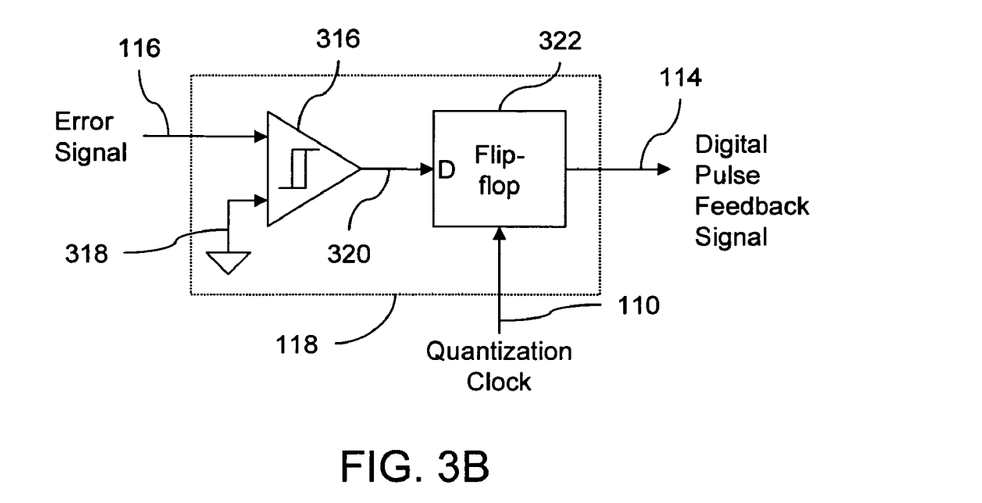
FIG. 3B is a block diagram illustrating an implementation of a converter according to a second embodiment of the disclosed invention.

Referring now primarily to FIG. 3B, an implementation of converter 118 according to the second embodiment of the disclosed invention is hereinafter described. The figure shows error signal 116 being fed to converter 118 to obtain digital pulse feedback signal 114 as the output. Error signal 116 is fed to a hysteretic comparator 316 for comparison with a ground voltage 318. Ground voltage 318 is the ground reference used for the implementation circuit. As such, ground voltage 318 is substantially equal to the median value of error amplifier 112 output. The operation of the hysteretic comparator is such that if the output of the comparator is high, then error signal 116 must go lower than ground voltage 318 by an amount equal to half the hysteresis value in order to cause the comparator output to go low. Similarly, if the output of the comparator is low, then error signal 116 must go higher than ground voltage 318 by an amount equal to half the hysteresis value in order to cause the comparator output to go high. At this point it is clear that the converter of FIG. 3B is functionally equivalent to the converter of FIG. 3A if the hysteresis value for the converter of FIG. 3B is equal to the difference between high signal 304 and low signal 310 in FIG. 3A. The value or magnitude of the hysteresis is not especially critical to the function of the converter of FIG. 3B, but rather prevents the comparator output from "chattering" in an unstable fashion. A side effect of this is that the hysteresis of the comparator sets a lower bound on the signal swing that can be expected in error signal 116. The result of this comparison is output as a hysteretic comparator output 320.

Hysteretic comparator output 320 is fed to a D flip-flop 322. Quantization clock 110 is used as the clock source for D flip-flop 322. The output thus obtained from D flip-flop 322 is digital pulse feedback signal 114.

Figure 4:
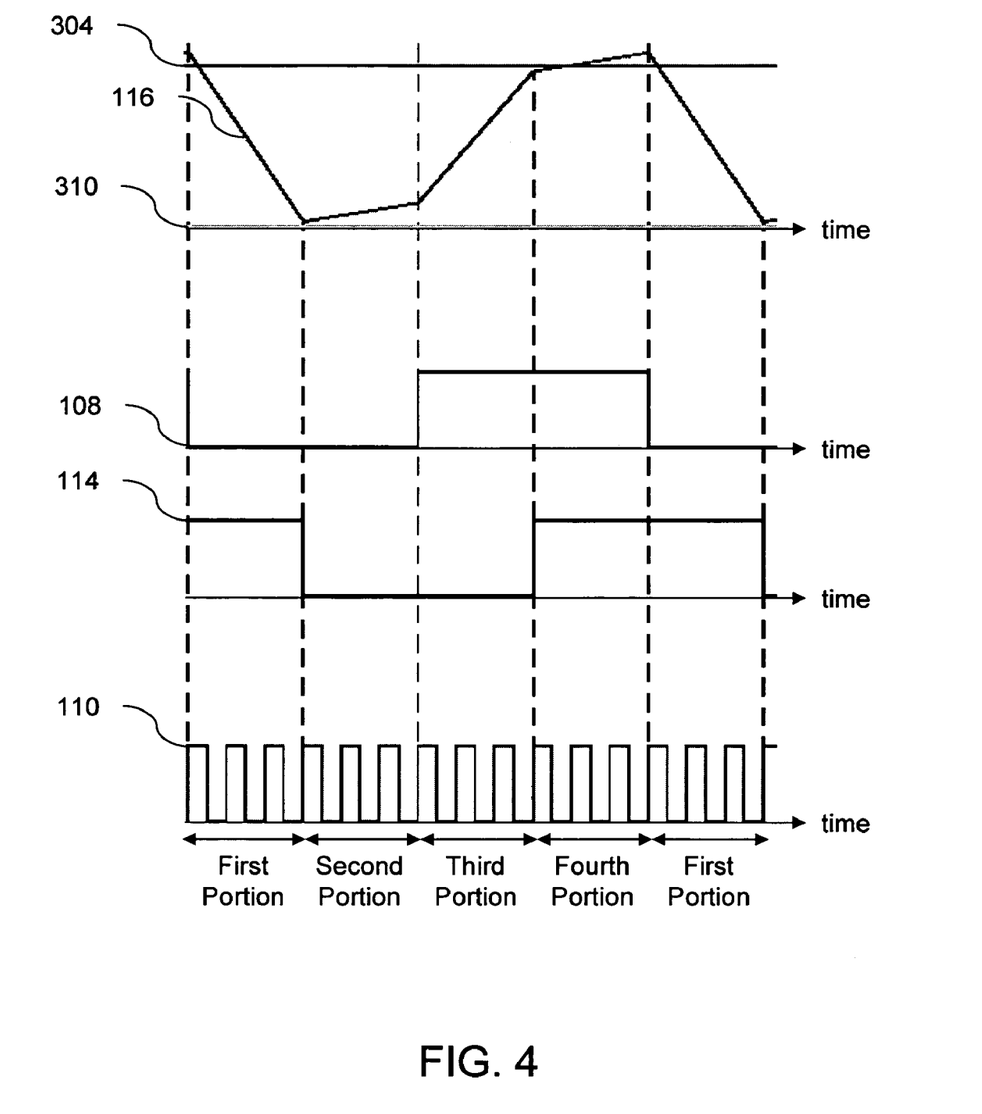
FIG. 4 is a graph illustrating the waveforms of various signals obtained from of the first embodiment of the disclosed invention.

Referring now primarily to FIG. 4, a graph illustrating the waveforms of various signals obtained from an implementation of the first embodiment of the disclosed invention is hereinafter described. The graph depicted in the figure is exemplary to show the working of the disclosed invention and should not be considered limiting. The plots have been made assuming a small direct current (DC) voltage value (say v volts) for analog input signal 104. The figure shows the plots for decimation clock 108, quantization clock 110, digital pulse feedback signal 114, error signal 116, high signal 304 and low signal 310 for this value of analog input signal 104. The plot is divided into four portions corresponding to the four states of a circuit according to the first embodiment of the disclosed invention.

The figure shows a first portion of the waveform plots wherein digital pulse feedback signal 114 is high (say H volts) and decimation clock 108 is low (say 0 volts). In this condition, the slope of error signal 116 is computed as—[analog input signal 104 (v volts)−digital pulse feedback signal 114 (H volts)+decimation clock 108 (0 volts)], that is—H+v volts. As voltage v is assumed to be small, the slope of error signal 116 is negative. Thus, error signal 116 decreases in value. While the value of error signal 116 remains between high signal 304 and low signal 310, the output of both first comparator 302 and second comparator 308 are low. Thus, both the J and K inputs of JK flip-flop 314 are low, and the output of JK flip-flop 314 remains unchanged. However when error signal 116 falls below low signal 310, the output of second comparator 308 goes high. In this condition, when the rising edge of quantization clock 110 triggers JK flip-flop 314, its output goes low. Thus, digital pulse feedback signal 114 takes the value of 0 volts. The change in the output of JK flip-flop 314 represents the encoding of a sample value into digital pulse feedback signal 114. Thus, at the end of the first portion, a first sample value is encoded into digital pulse feedback signal 114. This is known as the sample value stored in the right duty ratio of digital pulse feedback signal 114.

This is followed by the second portion of the waveform plots wherein digital pulse feedback signal 114 is low (0 volts) and decimation clock 108 is also low (say 0 volts). In this condition, the slope of error signal 116 is computed as—[analog input signal 104 (v volts)−digital pulse feedback signal 114 (0 volts)+decimation clock 108 (0 volts)], that is v volts. As the slope of error signal 116 is a small positive quantity it increases in value slowly. This portion continues till decimation clock 108 changes its value from low (0 volts) to high (H volts).

The change in decimation clock 108 brings about the third portion of the waveform plots wherein digital pulse feedback signal 114 is low (0 volts) and decimation clock 108 is high (H volts). In this condition, the slope of error signal 116 is computed as [analog input signal 104 (v volts)−digital pulse feedback signal 114 (0 volts)+decimation clock 108 (H volts)], that is H+v volts. This is a large positive slope, and hence error signal 116 increases at the fastest rate in this portion. While the value of error signal 116 remains between high signal 304 and low signal 310, the output of both first comparator 302 and second comparator 308 are low. Thus, both the J and K inputs of JK flip-flop 314 are low, and the output of JK flip-flop 314 remains unchanged. However when error signal 116 exceeds high signal 304, the output of first comparator 302 goes high. In this condition, when the rising edge of quantization clock 110 triggers JK flip-flop 314, its output goes high. Thus, digital pulse feedback signal 114 takes the value of H volts. Thus, at the end of the third portion, a second sample value is encoded into digital pulse feedback signal 114. This is known as the sample value stored in the left duty ratio of digital pulse feedback signal 114.

This leads to the fourth portion wherein digital pulse feedback signal 114 is high (H volts) and decimation clock 108 is high (H volts). In this condition, the slope of error signal 116 is computed as—[analog input signal 104 (v volts)−digital pulse feedback signal 114 (H volts)+decimation clock 108 (H volts)], that is v volts. As the slope of error signal 116 is a small positive quantity it increases in value slowly. This portion continues till decimation clock 108 changes its value from high (H volts) to low (0 volts). This change leads to a return to the first portion. In this manner, the four portions are repeated in a cycle for a constant value v as analog input signal 104.

Figure 5:
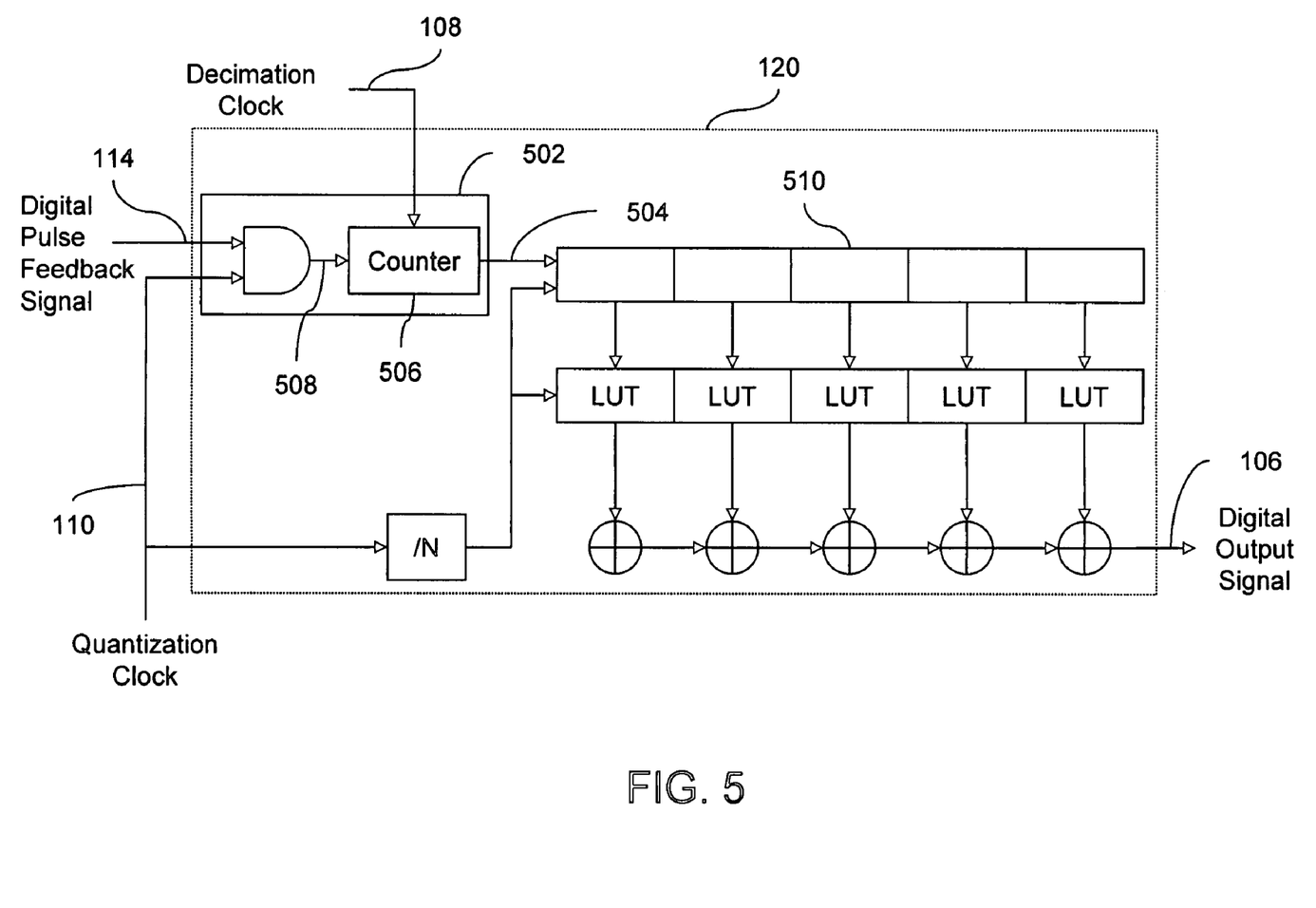
FIG. 5 is a block diagram illustrating an implementation of a decimator according to one embodiment of the disclosed invention.

Referring now primarily to FIG. 5, an implementation of decimator 120 according to one embodiment of the disclosed invention is hereinafter described. The figure shows digital pulse feedback signal 114 being fed to decimator 120 to obtain digital output signal 106 as the output. The function of the decimator is to convert the digital pulse feedback signal 114 to the more conventional format of PCM—preferably PCM with the lowest clock rate acceptable for the downstream digital processing. In a conventional sigma-delta modulator, this function is typically done by applying the digital pulse feedback signal to a combination of comb and low pass filters. While it is certainly possible to perform this function on the digital pulse feedback signal directly, doing this would require the decimator to perform most of its processing at the very fast quantization clock rate. It is more efficient and desirable to convert the digital pulse feedback signal to the duty ratio format first, and thus allow the remainder of the decimator to operate at the slower decimation clock 108 rate. This can be done in the following manner. Digital pulse feedback signal 114 is fed to a duty-ratio counter 502 to obtain the duty ratio of digital pulse feedback signal 114 as a duty ratio signal 504. According to one embodiment of the disclosed invention, duty-ratio counter 502 is implemented using a counter 506. Counter 506 is reset to zero count by both the rising as well as falling edge of decimation clock 108. Quantization clock 110 is ANDed with digital pulse feedback signal 114 to obtain a pulse count signal 508. Pulse count signal 508 is fed to the clock input of counter 506. The count of counter 506 is noted immediately before resetting it. This count indicates the duty ratio of digital pulse feedback signal 114, and is output as duty ratio signal 504. The sequence of duty ratio values is fed to a set of registers 510 that are arranged in a pipeline configuration such that 510 acts as a tapped delay line. The contents of each register in the tapped delay line 510 are used to address a look-up table (LUT). The results from the LUTs are then summed together to form the digital output signal 108 in PCM format with a sampling rate equal to the quantization clock 110 rate. One skilled in the art recognizes the latter portion of the decimator as a modified Finite Impulse Response or FIR filter. Look-up tables are used in place of the more conventional static gains in order to accomplish the necessary conversion from the duty ratio format to the PCM format.

Figure 6:
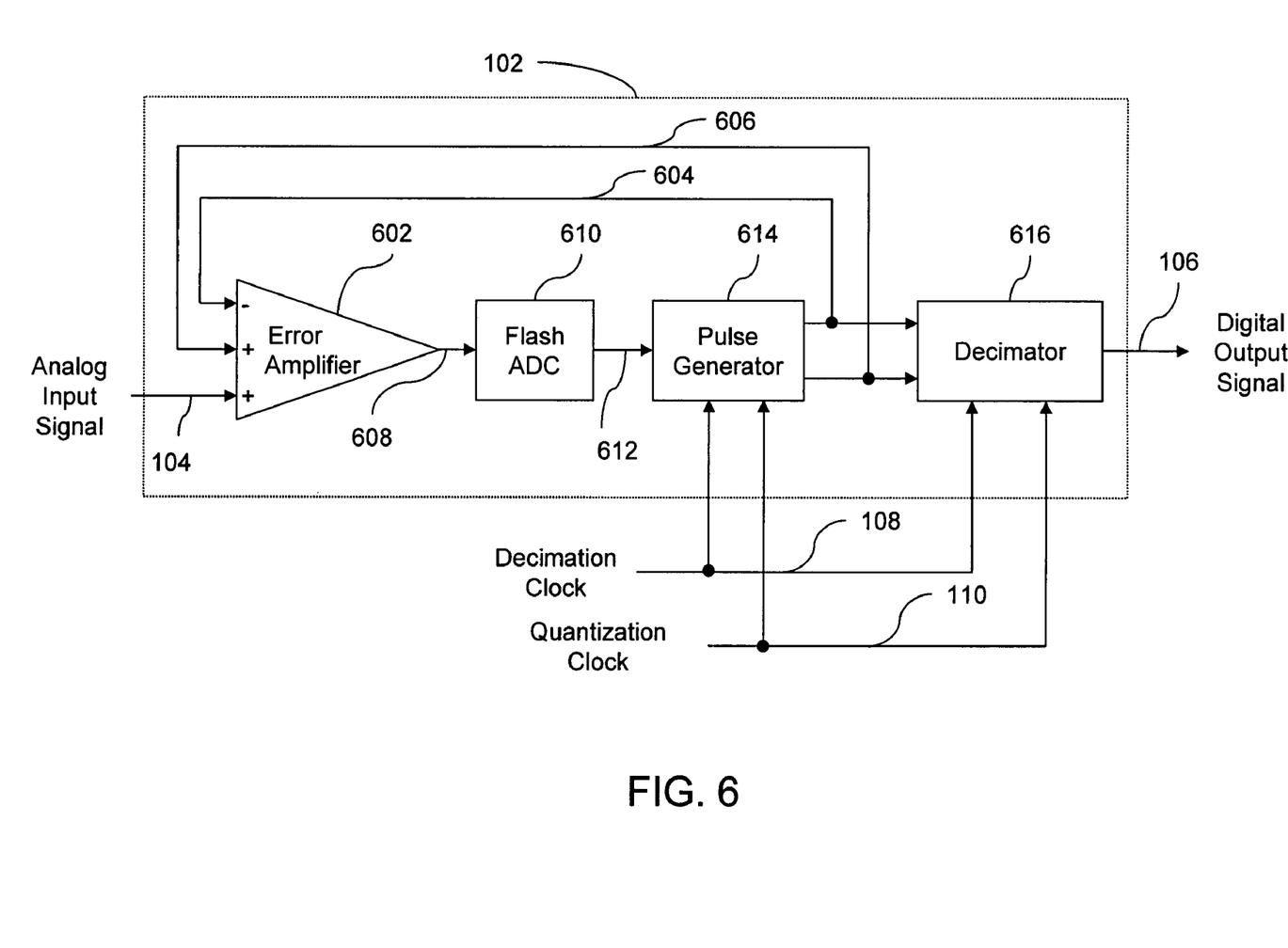
FIG. 6 is a block diagram illustrating an implementation of an ADC according to a third embodiment of the disclosed invention.
Figure 7:
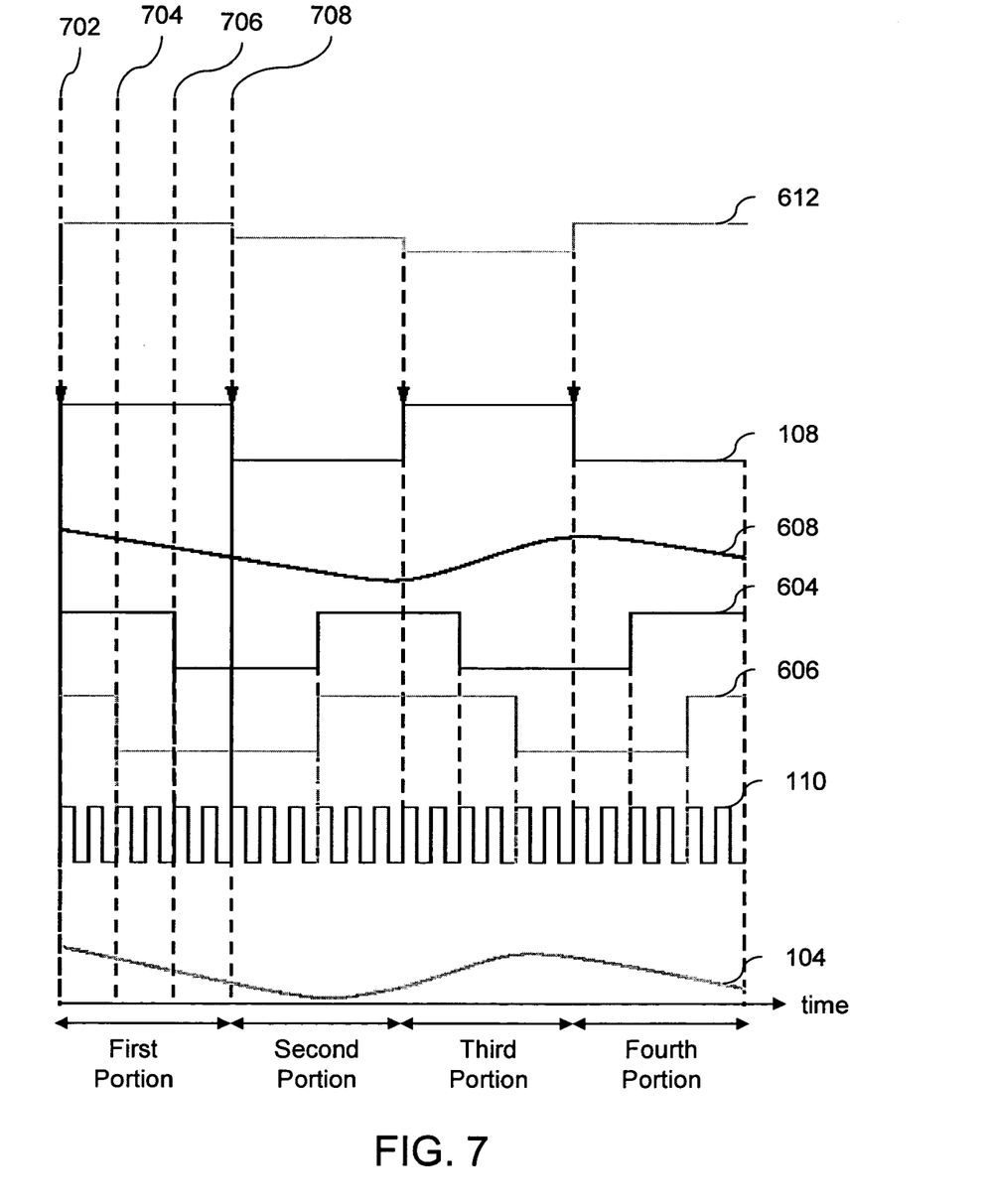
FIG. 7 is a graph illustrating the waveforms of various signals obtained from an implementation of the third embodiment of the disclosed invention.

Referring now primarily to FIG. 6, an implementation of an ADC according to the third embodiment of the disclosed invention is hereinafter described. The figure shows analog input signal 104 being fed to ADC 102 to obtain digital output signal 106 as the output. Analog input signal 104 is fed to an error amplifier 602 along with a first digital PWM feedback signal 604 and a second digital PWM feedback signal 606. The output of error amplifier 602, an error signal 608, is computed as (second digital PWM feedback signal 606−first digital PWM feedback signal 604+analog input signal 104). Error signal 608 is fed to a Flash ADC 610 that quantizes error signal 608 to produce a flash output 612. The amplitude of flash output 612 takes a quantized value corresponding to the amplitude of error signal 608, as shown in FIG. 7. Pulse generator 614 uses flash output 612 to generate first digital PWM feedback signal 604 and second digital PWM feedback signal 606. Flash output 612 is used to determine the duty ratios of first digital PWM feedback signal 604 and second digital PWM feedback signal 606. More specifically, the ON time of first digital PWM feedback signal 604 and the OFF time of second digital PWM feedback signal 606 are directly proportional to the amplitude of flash output 612. According to one embodiment of the disclosed invention, pulse generator 614 is implemented using two counters clocked at the rate of quantization clock 110. The edge of decimation clock 108 starts the count of these counters. The first counter counts up to the value of flash output 612, while the second counter counts down from a maximum counter value to the value of flash output 612. The maximum counter value is equal to the total number of quantization levels of Flash ADC 610, which is in turn equal to half the ratio of the frequency of quantization clock 110 to the frequency of decimation clock 108. For the waveforms described with reference to FIG. 7, the maximum count is 6.

Further, first digital PWM feedback signal 604 and second digital PWM feedback signal 606 are fed to a decimator 616. Decimator 616 converts the PWM signal pair to PCM format. According to one embodiment of the disclosed invention, the decimation of first digital PWM feedback signal 604 and second digital PWM feedback signal 606 is performed by decimator 616 using two decimators 120 (one for each half of the signal pair), and subtracting their results. It would be apparent to one skilled in the art that since the pulse generator 614 is a digital circuit, decimator 616 could be modified to process flash output 612 to obtain digital output signal 106. Further, it would also be apparent that any type of ADC with throughput delay less than one cycle of decimation clock 108 can be used in place of Flash ADC 610.

Referring now primarily to FIG. 7, a graph illustrating the waveforms of various signals obtained from an implementation of the third embodiment of the disclosed invention is hereinafter described. The graph depicted in the figure is exemplary to show the working of the disclosed invention and should not be considered limiting. The figure shows the plots for analog input signal 104, decimation clock 108, quantization clock 110, and flash output 612, error signal 608, first digital PWM feedback signal 604 and second digital PWM feedback signal 606 for this value of analog input signal 104. The plot is divided into four portions corresponding to the four states of a circuit according to the third embodiment of the disclosed invention.

The figure shows the waveform plots starting at an instant 702 at which first digital PWM feedback signal 604 and second digital PWM feedback signal 606 are high (say H volts). Analog input signal 104 takes a value (say $v_{702}$) at this instant. As a result, the slope of error signal 608 is given by (H−H+$v_{702}$ volts), or $v_{702}$ volts. As $v_{702}$ is a small negative value, error signal 608 decreases slowly. At an instant 702, error signal 608 is sampled at the rising edge of decimation clock 108 to obtain flash output 612 equal to 4. This signifies that error signal 608 has been quantized to the $4^{th}$ quantization level. The waveforms shown in the figure correspond to an embodiment of the disclosed invention that has 6 distinct quantization levels for flash output 612. This sampled value is used to obtain the duty ratios of first digital PWM feedback signal 604 and second digital PWM feedback signal 606. First digital PWM feedback signal 604 has a duty ratio of ((quantization level of flash output 612)/(total number of quantization levels)), in this case 4/6. Similarly, second digital PWM feedback signal 606 has a duty ratio of (1−(quantization level of flash output 612)/(total number of quantization levels)), in this case (1−4/6=2/6). In accordance with these duty ratios, second digital PWM feedback signal 606 goes low at an instant 704 and second digital PWM feedback signal 604 goes low at an instant 706.

Subsequently, the second portion of the waveform plot commences at an instant 708 wherein both first digital PWM feedback signal 604 and second digital PWM feedback signal 606 are low (0 volts). The value of analog input signal 104 at instant 708 (say $v^{708}$) determines the slope of error signal 608. This slope is (0−0+$v_{708}$ volts), or $v_{708}$ volts. At instant 708, error signal 608 is sampled at the rising edge of decimation clock 108 to obtain flash output 612 equal to 3, signifying that error signal 608 has been quantized to the $3^{rd}$ quantization level. This is used to determine the duty ratios of first digital PWM feedback signal 604 and second digital PWM feedback signal 606 as 3/6 and 3/6 (1−3/6=3/6) respectively. A similar approach is used to determine the duty ratios of first digital PWM feedback signal 604 and second digital PWM feedback signal 606 as 2/6 and 4/6 (1−2/6=4/6) in the third portion, and 4/6 and 2/6 (1−4/6=2/6) in the fourth portion respectively.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A system for performing analog-to-digital conversion of an analog input signal to a digital output signal using digital pulse width modulation, the sampling frequency of the analog-to-digital conversion being controlled by a decimation clock and the resolution of the analog-to-digital conversion being controlled by a quantization clock, the system comprising:
   a. an error amplifier computing an error signal using the analog input signal, the decimation clock and a digital pulse feedback signal;
   b. a converter converting the error signal into the digital pulse feedback signal; and
   c. a decimator decimating the digital pulse feedback signal using the decimation clock and the quantization clock to obtain the digital output signal.

2. The system according to claim 1 wherein the error amplifier is a continuous time integrating error amplifier.

3. The system according to claim 1 wherein the converter comprises:
   a. a first comparator comparing a high signal and the error signal to obtain a first comparator output;
   b. a second comparator comparing the error signal and a low signal to obtain a second comparator output; and
   c. a JK flip-flop generating the digital pulse feedback signal using the first comparator output, the second comparator output and the quantization clock.

4. The system according to claim 1 wherein the converter comprises:

a. a hysteretic comparator comparing the error signal and the ground voltage to obtain a hysteretic comparator output signal; and b. a D flip-flop generating the digital pulse feedback signal using the hysteretic comparator output and the quantization clock.

5. The system according to claim 1 wherein the decimator comprises:

a. a comb filter eliminating clock harmonics from the digital pulse feedback signal to obtain a comb-filtered signal;

b. a low-pass filter attenuating the high frequency quantization noise of the comb-filtered signal to obtain a low-pass filtered signal; and c. a down-sampler down-sampling the low-pass filtered signal at a slower rate than the quantization clock to obtain the digital output signal.

6. The system according to claim 1 wherein the decimator comprises:

a. a duty-ratio counter extracting the duty ratio of the digital pulse feedback signal to obtain a duty ratio value; and b. a plurality of look-up tables selecting the value of the digital output signal using the duty ratio value.

7. A system for performing analog-to-digital conversion of an analog input signal to a digital output signal using digital pulse width modulation, the sampling frequency of the analog-to-digital conversion being controlled by a decimation clock and the resolution of the analog-to-digital conversion being controlled by a quantization clock, the system comprising:

a. an error amplifier computing an error signal using the analog input signal and a digital PWM feedback signal pair;

b. a Flash ADC digitizing the error signal to obtain a multi-bit digital signal;

c. a pulse generator generating the digital PWM feedback signal pair using the multi-bit digital signal, the quantization clock and the decimation clock; and d. a decimator decimating the digital PWM feedback signal pair using the decimation clock and the quantization clock to obtain the digital output signal.

8. The system according to claim 7 wherein the error amplifier is a continuous time integrating error amplifier.

9. The system according to claim 7 wherein the decimator comprises:

a. a first duty-ratio counter extracting the duty ratio of the first signal of the digital PWM feedback signal pair to obtain a first duty ratio value;

b. a second duty-ratio counter extracting the duty ratio of the second signal of the digital PWM feedback signal pair to obtain a second duty ratio value; and c. a plurality of look-up tables selecting the value of the digital output signal using the first duty ratio value and the second duty ratio value.

10. A method for performing analog-to-digital conversion of an analog input signal to a digital output signal using digital pulse width modulation, the sampling frequency of the analog-to-digital conversion being controlled by a decimation clock and the resolution of the analog-to-digital conversion being controlled by a quantization clock, the method comprising:

a. computing an error signal using the analog input signal, the decimation clock and a digital pulse feedback signal;

b. converting the error signal into the digital pulse feedback signal; and c. decimating the digital pulse feedback signal using the decimation clock and the quantization clock to obtain the digital output signal.

11. The method according to claim 10 wherein converting the error signal comprises:

a. comparing a high signal and the error signal to obtain a first comparator output;

b. comparing the error signal and a low signal to obtain a second comparator output; and c. generating the digital pulse feedback signal using the first comparator output, the second comparator output and the quantization clock.

12. The method according to claim 10 wherein converting the error signal comprises:

a. comparing the error signal and the ground voltage to obtain a hysteretic comparator output signal; and b. generating the digital pulse feedback signal using the hysteretic comparator output and the quantization clock.

13. The method according to claim 10 wherein decimating the digital pulse feedback signal comprises:

a. eliminating the clock harmonics from the digital pulse feedback signal to obtain a comb-filtered signal;

b. attenuating the high frequency quantization noise of the comb-filtered signal to obtain a low-pass filtered signal; and c. down-sampling the low-pass filtered signal at a slower rate than the quantization clock to obtain the digital output signal.

14. The method according to claim 10 wherein decimating the digital pulse feedback signal comprises:

a. extracting the duty ratio of the digital pulse feedback signal to obtain a duty ratio value; and b. selecting the value of the digital output signal using the duty ratio value.

15. The method according to claim 14 wherein extracting the duty ratio comprises:

a. initializing a counter to zero before the ON period of the digital pulse feedback signal;

b. incrementing the counter at a pre-determined rate during the ON period of the digital pulse feedback signal; and c. selecting the duty ratio value using the final count of the counter.

16. A method for performing analog-to-digital conversion of an analog input signal to a digital output signal using digital pulse width modulation, the sampling frequency of the analog-to-digital conversion being controlled by a decimation clock and the resolution of the analog-to-digital conversion being controlled by the quantization clock, the method comprising:

a. computing an error signal using the analog input signal and a digital PWM feedback signal pair;

b. digitizing the error signal using Flash analog-to-digital conversion to obtain a multi-bit digital signal;

c. generating the digital PWM feedback signal pair using the multi-bit digital signal, the quantization clock and the decimation clock; and d. decimating the digital PWM feedback signal pair using the decimation clock and the quantization clock to obtain the digital output signal.

17. The method according to claim 16 wherein decimating the digital PWM feedback signal comprises:
   a. extracting the duty ratio of the first signal of the digital PWM feedback signal pair to obtain a first duty ratio value;
   b. extracting the duty ratio of the second signal of the digital PWM feedback signal pair to obtain a second duty ratio value; and
   c. selecting the value of the digital output signal using the first duty ratio value and the second duty ratio value.

18. The method according to claim 10 wherein one or more steps are embodied in a computer program product.

19. The method according to claim 16 wherein one or more steps are embodied in a computer program product.

* * * * *